United States Patent

Ogura et al.

[11] Patent Number: 5,943,266
[45] Date of Patent: Aug. 24, 1999

[54] SEMICONDUCTOR INTEGRATED CIRCUIT DEVICE EMPLOYING A PROGRAMMING CIRCUIT HAVING INCREASED IMMUNITY TO GATE DISTURBANCE AND METHOD OF PROGRAMMING THEREFOR

[75] Inventors: Taku Ogura; Shinichi Kobayashi, both of Hyogo, Japan

[73] Assignee: Mitsubishi Denki Kabushiki Kaisha, Tokyo, Japan

[21] Appl. No.: 09/015,626

[22] Filed: Jan. 29, 1998

[30] Foreign Application Priority Data

Jul. 25, 1997 [JP] Japan .................................... 9-199878

[51] Int. Cl.[6] .................................................. G11C 16/04
[52] U.S. Cl. ................ 365/185.28; 365/185.22; 365/185.24; 365/185.09
[58] Field of Search ................ 365/185.24, 185.22, 365/185.3, 185.2, 185.09; 315/185.02, 185.11, 185.21, 189.29, 185.33

[56] References Cited

U.S. PATENT DOCUMENTS

| | | | |
|---|---|---|---|
| 5,742,543 | 4/1998 | Fazio | 365/185.21 |
| 5,748,538 | 5/1998 | Lee et al. | 365/185.06 |
| 5,818,753 | 10/1998 | Gotou | 365/185.29 |

FOREIGN PATENT DOCUMENTS 7-141892  6/1995  Japan .

Primary Examiner—David Nelms
Assistant Examiner—Gene N. Auduong
Attorney, Agent, or Firm—McDermott, Will & Emery

[57] ABSTRACT

Every time a program pulse is applied, transition in source potential connected to a selected cell is detected and the source potential is clamped. When the source potential exists an overbit generation detection level, transition in threshold voltage of a non-selected cell connected to the same sub bit as the selected cell and existing in a different page than the selected cell is detected, and the threshold voltage is recovered. Threshold voltage verifying operation is performed on the same page as the selected cell.

21 Claims, 14 Drawing Sheets

SEMICONDUCTOR INTEGRATED CIRCUIT DEVICE EMPLOYING A PROGRAMMING CIRCUIT HAVING INCREASED IMMUNITY TO GATE DISTURBANCE AND METHOD OF PROGRAMMING THEREFOR

BACKGROUND OF THE INVENTION

1. Field of the Invention

The present invention relates to a semiconductor integrated circuit device and to a method of programming. More specifically, the present invention relates to a semiconductor integrated circuit device having electrically erasable and programmable non-volatile memory and a method of programming therefor.

2. Description of the Background Art

An electrically erasable and programmable flash memory has been known as one of non-volatile semiconductor memory devices. A DINOR (Divided bit-line NOR) type flash memory will be described in the following as an example of the non-volatile semiconductor memory devices.

Referring to FIG. 9, a memory block #1 of a conventional flash memory includes a plurality of memory cells M. The plurality of memory cells M are divided into a plurality of groups by select gate portions SG (SG1, . . . , SG4). Though not shown, the conventional flash memory may includes a plurality of memory blocks #2 to #n each having the same structure as memory block #1.

Configuration of the plurality of memory cells M divided into groups by the select gate portions SG will be described in the following.

The plurality of memory cells M are arranged in a matrix. A plurality of memory cells arranged in the row direction are connected to corresponding word lines WL (WL1, . . . , WLm), and a plurality of memory cells arranged in the column direction are connected to corresponding sub bit lines SBL (SBL1, . . . , SBLn), respectively. Each sub bit line SBL is connected to a main bit line MBL (MBL1, . . . , MBLn) through a transistor t0 constituting the select gate portion SG1.

Relation between the memory cells M divided into groups by select gate portion SG1 and the memory cells M divided into groups by select gate portion SG2, SG3 or SG4 will be described.

The main bit line MBL is common to respective groups. Word lines WL (WL1, . . . WLm) are common to the groups divided by select gate portion SG1 and groups divided by select gate portion SG2 (similarly, these are common to groups divided by select gate portions SG3 and SG4). These word lines WL (WL1, . . . , WLm) are connected to a common word line driver line WLD (WLD1, . . . , WLDm).

For simplicity, the select gate portion will be denoted by SG, word line by WL, main bit line by MBL, sub bit line by SBL and word line driver line by WLD.

When any of the word line driver lines WLDs attains to the H (high) level, a corresponding word line WL is set to a selected state.

A collection of memory cells M within a group selected by any one of the selected gate portions (SG1 to SG4) and connected to that word line which is selected by the word line driver line WLD is referred to as a page.

By selecting a page and by setting one main bit line MBL to the selected state, a memory cell M to which writing is to be done, is selected. Programming of a memory cell M belonging to the selected page is referred to as page programming.

Writing of information to the memory cells M constituting the conventional flash memory will be described with reference to FIG. 10. Writing to a memory cell M is performed by changing threshold voltage thereof.

Referring to the threshold voltage distribution of the memory cell M shown in FIG. 10, a state in which the threshold voltage is within the range of depletion verify voltage VDV to program verify voltage VPV is referred to as a programmed state or a state storing data "0". A state in which the threshold voltage is higher than the erase verify voltage VEV is referred to as an erased state or a state storing data "1". The state in which the threshold voltage is lower than the depletion verify voltage VDV is referred to as an over programming state (hereinafter, the memory cell M in this state will be referred to as an over bit cell OPbit).

When memory cell M is to be set to the programmed state, the threshold voltage is controlled so that it is within the range of VDV voltage to VPV voltage. When memory cell M is to be set to the erased state, the threshold voltage is controlled such that it attains higher than the VEV voltage.

In the following, for simplicity, the memory cell M AS selected for programming will be referred to as a selected cell M0 and other memory cells M will be referred to as non-selected cells M1.

The method of programming selected cell M0 and disturbance associated with programming will be described with reference to FIG. 11.

Though basic configuration of non-selected cell M1 is not described, it is the same as selected cell M0 except the condition of voltage application.

Referring to FIG. 11, selected cell M0 includes a control gate electrode layer 90, a floating gate layer 91, a drain region 92 and a source region 93. Drain and source regions 92 and 93 are formed spaced by a prescribed distance in a substrate 94. Control gate electrode 90 is connected in the row direction, to word line WL. Drain region 92 is connected to main bit line MBL through select gate portion SG. Source region 93 is connected to a source line SL.

At the time of programming, a negative high voltage is input to control gate electrode 90 through the word line WL to which selected cell M0 is connected. A positive high voltage from the main bit line MBL is applied through select gate portion SG to drain region 92. Source region 93 is at a floating state. Accordingly, electrons existing in floating gate electrode layer 91 are drawn by tunneling phenomenon, to the drain region 92. As a result, a state of low threshold voltage (data "0") is attained.

It is known that when a voltage is applied to selected cell M0, the data stored in non-selected cell M1 is disturbed. Here, disturbance means that the voltage applied to non-selected cell M1 during writing, erasure or reading of selected cell M0 fluctuates, resulting in fluctuation of the threshold voltage of non-selected cell M1.

Gate disturbance experienced at a non-selected cell M1 will be described with reference to FIG. 12.

Referring to FIG. 12, drain region 92 and source region 93 of non-selected cell M1 (data "1") connected to the same word line WL as selected cell M0 are at the floating state.. To control gate electrode layer 90, a negative high voltage is applied through word line WL, as in selected cell M0.

Under this voltage application condition, it is possible that electrons undesirably move to substrate 94 from floating gate electrode layer 91 of none-selected cell M1. This means that non-selected cell M1 makes a transition from a state of high threshold voltage (data "1") to a state of low threshold voltage. Disturbance experienced by non-selected cell M1 under such voltage application condition is specifically referred to as gate disturbance.

In view of the foregoing, in an electrically erasable and programmable memory cell M, it is important to solve the problem of disturbance experienced in the non-selected cell M1 to ensure high reliability.

The conventional flash memory further experiences the problem that immunity to gate disturbance deteriorate as the source potential VS increases by the gate disturbance.

Relation between the source potential VS and immunity to gate disturbance will be described with reference to FIGS. 13, 14 and 15.

Referring to FIGS. 13 and 14, every time a program pulse is applied (time T1 to T6), drain potential VD of selected cell M0 changes and source potential VS rises.

When source potential VS increases, the electric field between control gate electrode layer 90 and source region 93 (FIG. 12) intensifies, and as a result, it becomes highly possible that gate disturbance is accelerated.

Referring to FIG. 15, when source potential VS rises (time T1 to T3) and an overbit cell OPbit results (time T4), and further the program pulse is applied, the source potential VS exceeds the upper limit Vgd.max of tolerable range of the gate disturbance immunity (time T5 to T6) because of the leak current flowing through overbit cell OPbit.

In order to solve this problem, source potential VS may be clamped when it exceeds a certain level. However, the method of simply clamping source potential VS still has the following problem.

More specifically, when the source potential VS is clamped, the source potential VS never exceeds the upper limit Vgd.max of the tolerable range of gate disturbance immunity. However, referring to FIG. 16, it means that a voltage at the clamp level Vclamp is continuously applied (T4 to T6) to the source line SL until programming of the selected cell M0 connected to the sub bit line SBL having overbit cell OPbit connected thereto is completed. This causes increase in gate disturbance stress, which may possibly deteriorate immunity to gate disturbance.

This may possibly prevented by setting lower the clamp potential Vclamp. However, if clamp potential Vclamp is set low, load current flowing through a circuit applying a high voltage to drain region 9,2 (FIG. 11) of selected cell M0 increases, causing another problem that a desired high voltage cannot be generated.

In a conventional program sequence P1, an operation of erasing and writing all over again is performed on the generated overbit cell, so as to recover the threshold voltage and to prevent deterioration of gate disturbance immunity. However, the conventional program sequence P1 suffers from the following problem.

The conventional program sequence P1 (for a page program) will be described with reference to FIG. 17.

The conventional program sequence P1 shown in FIG. 17 includes Sequence 1 (steps S1 to S3) and Sequence 2 (steps S4 to S6).

In steps S1, before applying the program pulse to selected cell M0, program verifying operation is performed. In steps S2, the program pulse is applied to the selected cell M0. In step S3, program verifying operation is performed in selected cell M0. Sequence 1 is performed on all the memory cells M in the selected page.

In step S4, depletion verifying operation is performed only on the selected page, to detect any overbit cell OPbit which is in the over programmed state. When there is not an overbit cell OPbit, programming of the selected page is completed.

When there is an overbit cell Opbit, the operation of erasing is performed on overbit cell OPbit in step S5. More specifically, channel hot electrons are injected to the overbit cell OPbit. Consequently, the threshold voltage is set higher than depletion verify voltage VDV. In steps S6, Sequence 1 is performed, so that the threshold voltage is made lower than the program verify voltage VPV.

However, in the conventional DINOR type flash memory, gate disturbance is possible not only in the non-selected cells M1 in the selected page but also non-selected cells M1 connected to the same word line WL of different groups.

Therefore, in the conventional flash memory, when the conventional program sequence is performed, overbit cells OPbit existing in pages other than the selected page are left as they are, which may deteriorate immunity to gate disturbance.

SUMMARY OF THE INVENTION

Therefore, an object of the present invention is to provide a semiconductor integrated circuit device which allows improvement in immunity to gate disturbance.

Another object of the present invention is to provide a method of programming which allows improvement in immunity to gate disturbance.

According to an aspect, the present invention provides a programming method for writing to a non-volatile semiconductor memory device in a semiconductor integrated circuit device including electrically erasable, programmable and readable non-volatile semiconductor memory, including the steps of: setting any one of a plurality of memory cells constituting the non-volatile semiconductor memory to a selected state and applying a program pulse; detecting transition in potential of a source line connected to the memory cell of the selected state when the program pulse is applied to the memory cell of the selected state, and clamping potential of the source line; and based on result of detection in the step of clamping, recovering threshold voltage of memory cells of non-selected state connected to the same sub bit line as the selected memory cell.

Therefore, according to this aspect, the present invention has an advantage that increase in source potential, which may deteriorate gate disturbance immunity, can be suppressed, and that threshold voltage, which fluctuates because of gate disturbance, of non-selected memory cells connected to the same sub bit line as the selected memory cell can be recovered. Accordingly, immunity to gate disturbance can be improved.

According to another aspect, the present invention provides a semiconductor integrated circuit device including an electrically erasable, programmable and readable non-volatile semiconductor memory, which includes a decode circuit for setting any one of a plurality of memory cells constituting the non-volatile semiconductor memory to a selected state; a write circuit for writing to the selected memory cell in accordance with the decode circuit; a plurality of source lines connected to the plurality of memory cells; a clamp circuit for detecting transition in potential of a source line connected to the selected memory cell at the time of writing to the selected memory cell, for clamping the potential of the source lines; and a recovering circuit, in accordance with result of detection by the clamping circuit, for recovering threshold value of the non-selected memory cell connected to the same sub bit line as the selected memory cell.

Therefore, according to this another aspect, the present invention has the advantage that in the semiconductor integrated circuit device, increase in source potential which causes deterioration of immunity to gate disturbance can be suppressed, and that threshold voltage, which fluctuates because of gate disturbance, of the non-selected memory cells connected to the same sub bit line as the selected memory cell can be recovered. Therefore, immunity to gate disturbance can be improved.

According to an aspect, the present invention provides a programming method for writing to a non-volatile semiconductor memory device in a semiconductor integrated circuit device including electrically erasable, programmable and readable non-volatile semiconductor memory, including the steps of: setting any one of a plurality of memory cells constituting the non-volatile semiconductor memory to a selected state and applying a program pulse; detecting transition in potential of a source line connected to the memory cell of the selected state when the program pulse is applied to the memory cell of the selected state; and based on result of detection in the step of detecting transition in potential recovering threshold voltage of memory cells of non-selected state connected to the same sub bit line as the selected memory cell.

Therefore, according to this aspect, the present invention has an advantage that increase in source potential, which may deteriorate gate disturbance immunity, can be detected, and that threshold voltage, which fluctuates because of gate disturbance, of non-selected memory cells connected to the same sub bit line as the selected memory cell can be recovered. Accordingly, immunity to gate disturbance can be improved.

According to another aspect, the present invention provides a semiconductor integrated circuit device including an electrically erasable, programmable and readable non-volatile semiconductor memory, which includes a decode circuit for setting any one of a plurality of memory cells constituting the non-volatile semiconductor memory to a selected state; a write circuit for writing to the selected memory cell in accordance with the decode circuit; a plurality of source lines connected to the plurality of memory cells; potential transition detecting circuit for detecting transition in potential of a source line connected to the selected memory cell at the time of writing to the selected memory cell; and a recovering circuit, in accordance with result of detection by the potential transition detecting circuit, for recovering threshold value of the non-selected memory cell connected to the same sub bit line as the selected memory cell.

Therefore, according to this another aspect, the present invention has the advantage that in the semiconductor integrated circuit device, increase in source potential which causes deterioration of immunity to gate disturbance can be detected, and that threshold voltage, which fluctuates because of gate disturbance, of the non-selected memory cells connected to the same sub bit line as the selected memory cell can be recovered. Therefore, immunity to gate disturbance can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
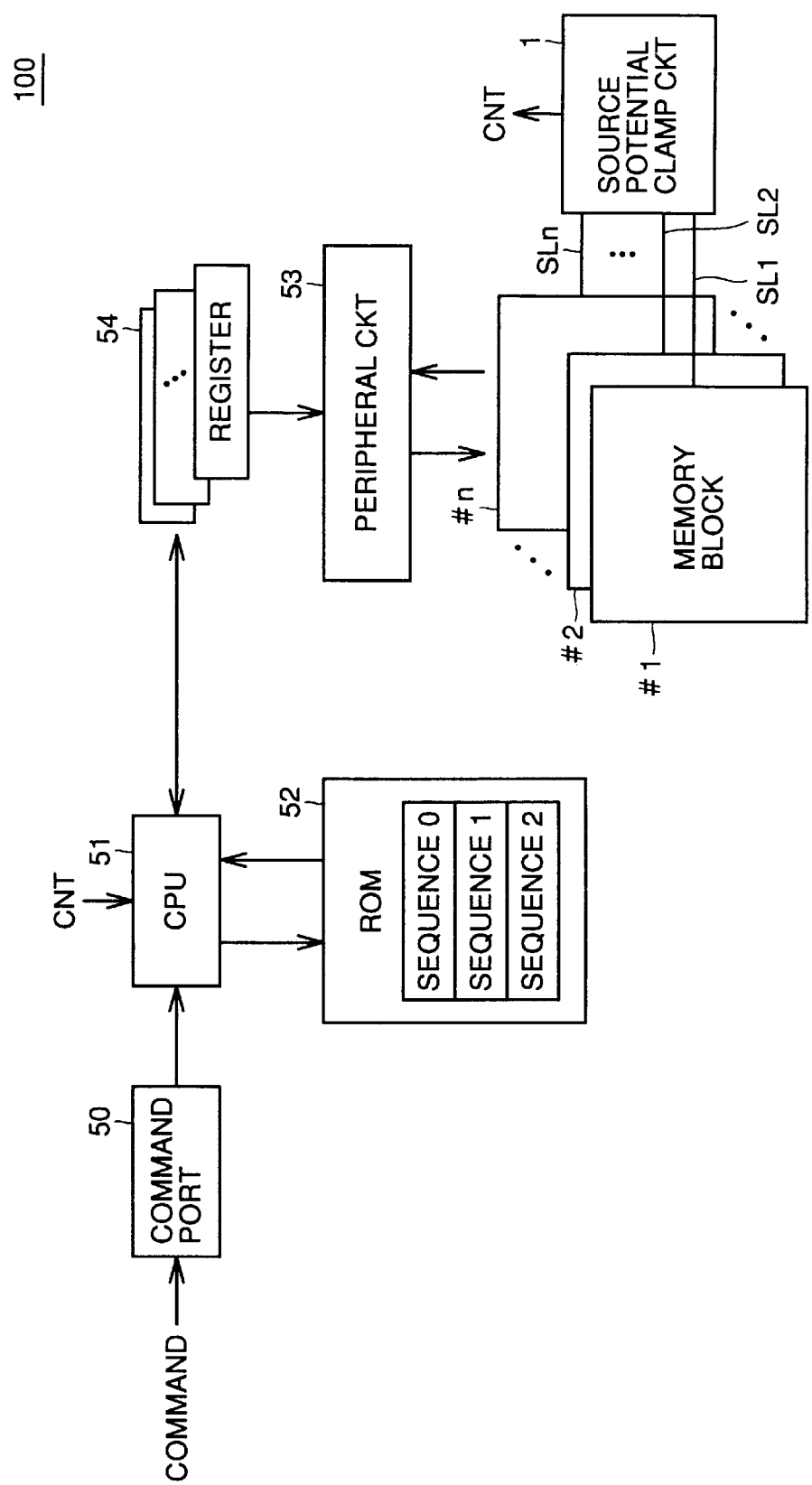
FIG. 1 is a block diagram schematically showing a structure of a semiconductor integrated circuit device 100 in accordance with a first embodiment of the present invention.

Embodiments of the present invention will be described with reference to the figures. In the following, like components are denoted by the same reference characters and description thereof is not repeated.

First Embodiment

Combination of a semiconductor integrated circuit device 100 in accordance with a first embodiment will be described with reference to the block diagram of FIG. 1.

Figure 9:
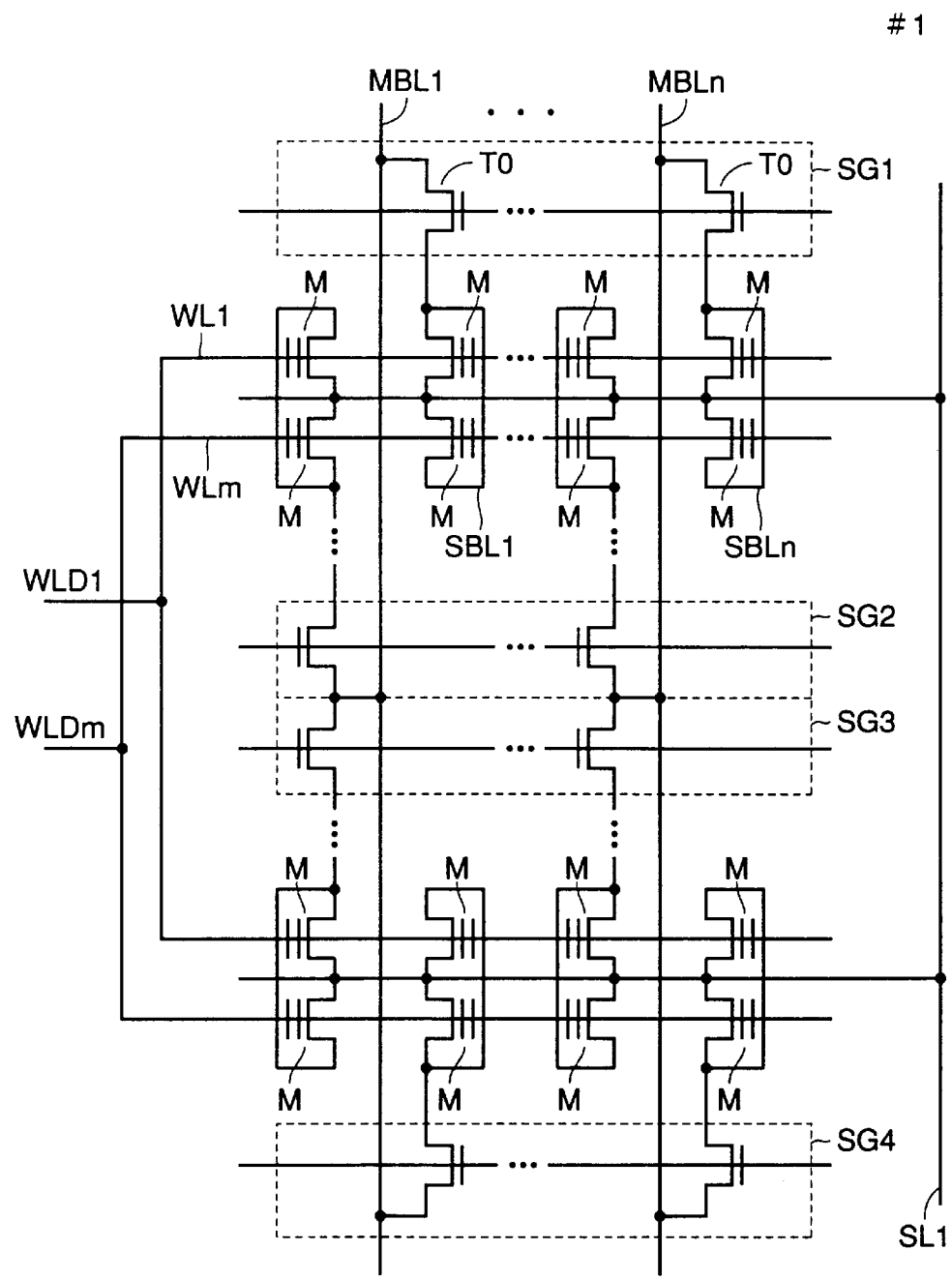
FIG. 9 is a schematic diagram showing a basic configuration of a memory block included in a conventional flash memory.
Figure 10:
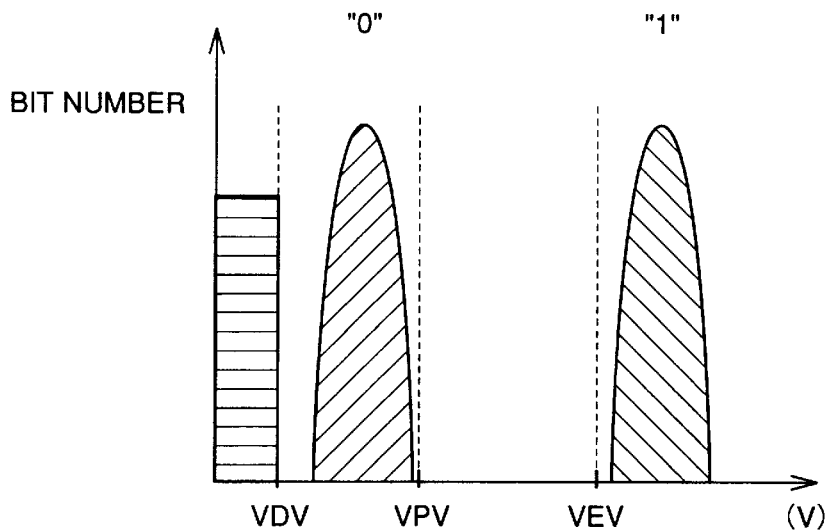
FIG. 10 shows threshold voltage distribution of a memory cell M.
Figure 11:
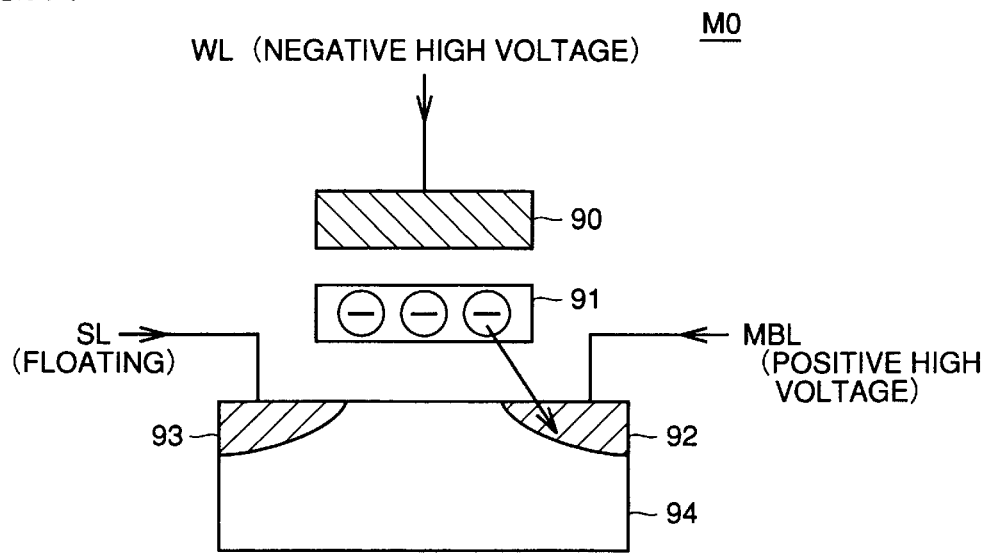
FIG. 11 shows cross section of selected cell M0 and conditions of voltage application at the time of programming.
Figure 12:
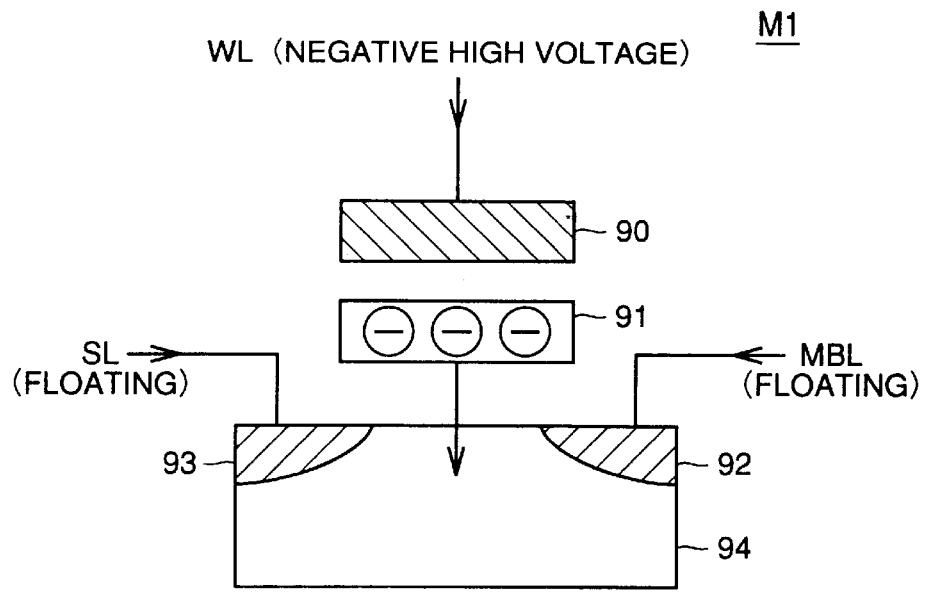
FIG. 12 shows condition of voltage application applied to a non-selected cell M1 (data "1"1) connected to the same word line WL as the selected cell M cell.
Figure 13:
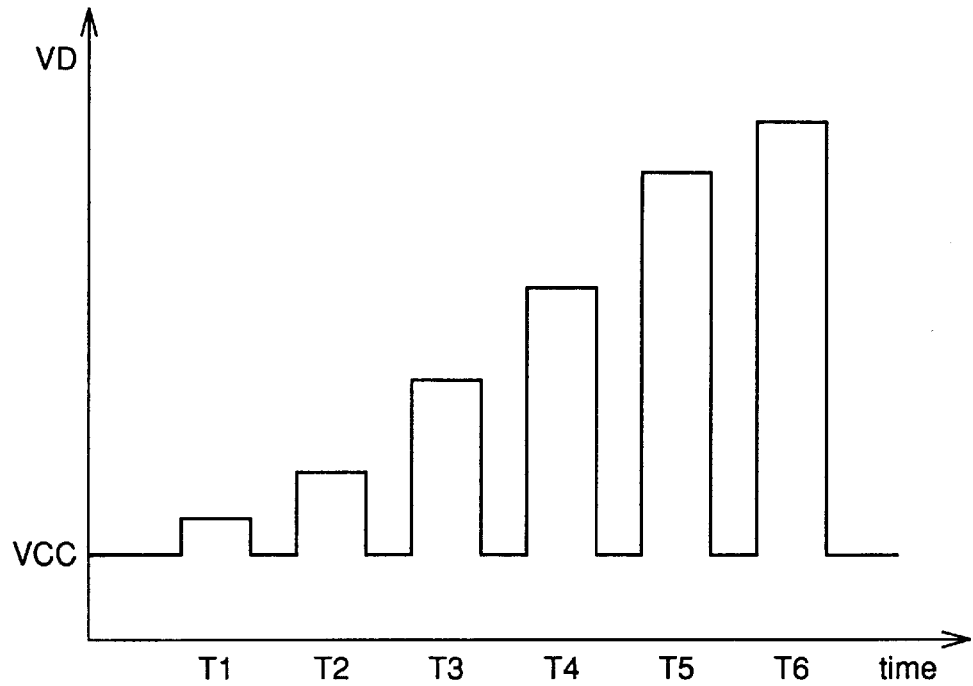
FIG. 13 shows change with time of drain voltage VD in the selected cell M0 at the time of page programming.
Figure 14:
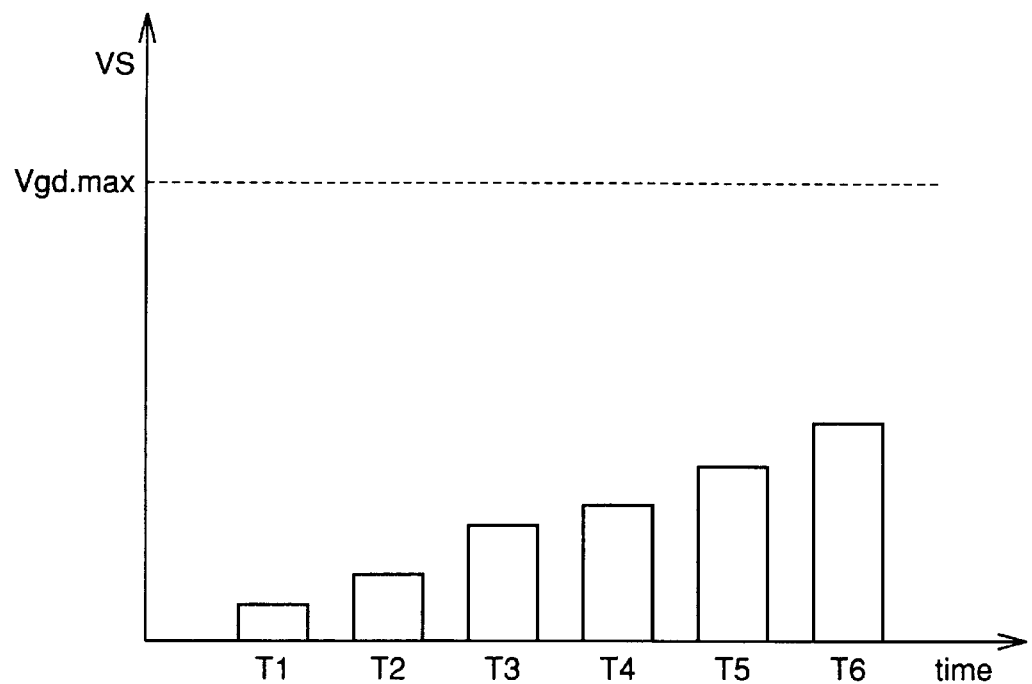
FIG. 14 shows change with time of source potential VS at the time of page programming.
Figure 15:
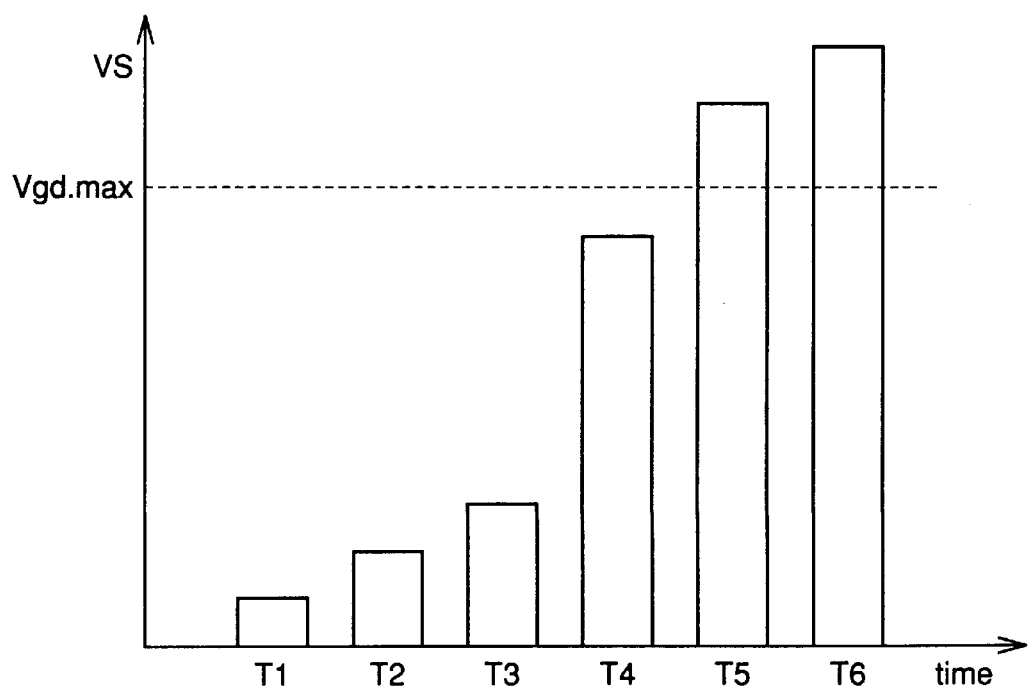
FIG. 15 shows change with time of source potential VS when an overbit cell OPbit is generated.
Figure 16:
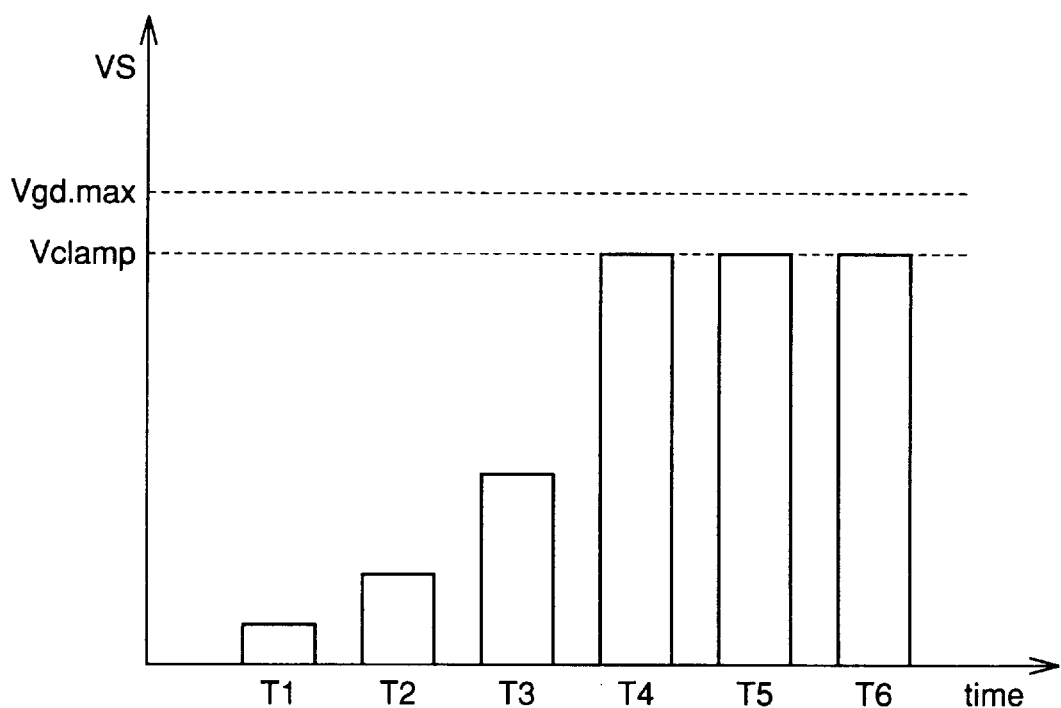
FIG. 16 shows change with time of source potential VS when it is clamped, at the time of page programming.
Figure 17:
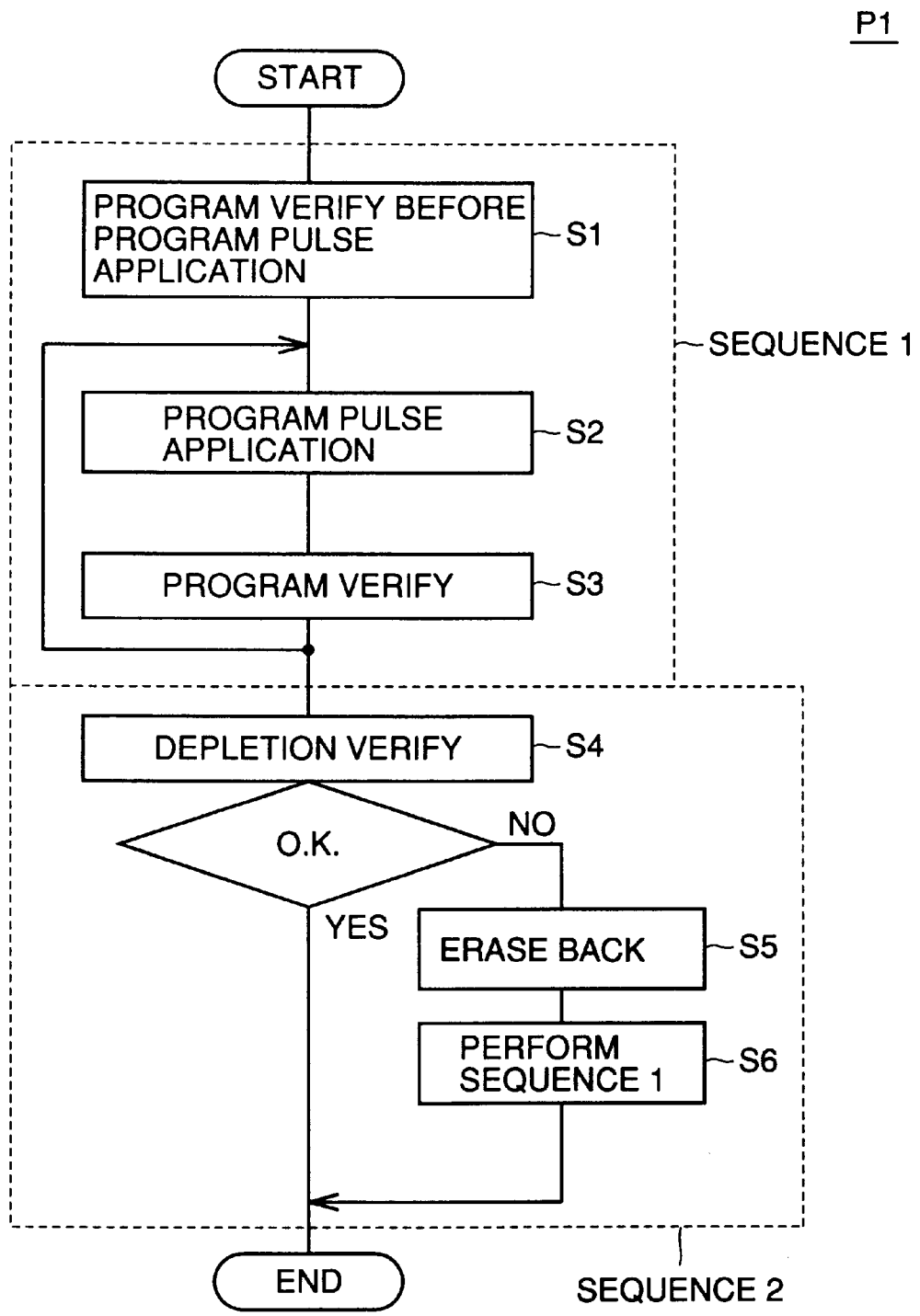
FIG. 17 is a flow chart showing a conventional program sequence P1.

Referring to FIG. 1, semiconductor integrated circuit device 100 in accordance with the first embodiment includes memory blocks #1 to #n, and a source potential clamp circuit 1. Memory blocks #1 to #n are non-volatile semiconductor memory device, of which configuration is as described with reference to the conventional flash memory shown in FIG. 9.

Source potential clamp circuit 1 is connected to source line SL (in the figure, lines SL1 . . . , SLn) of each of the memory blocks #1 to #n. Source potential clamp circuit 1 detects, at the time of programming, transition in source potential VS of source line SL connected to the selected cell M0. A control signal CNT is output as a result of detection.

Semiconductor integrated circuit device 100 further includes a command port 50, a CPU 51, an ROM 52, peripheral circuitry 53 and registers 54.

Command port 50 decodes an externally input command. In accordance with the decoded command, CPU 51 reads data of ROM 52 and sets the read data in registers 54.

Peripheral circuitry 53 has its state changed based on the value set in registers 54, which will be described later. At the time of writing, reading or erasure, one memory cell M which is the object of operation is selected out of memory blocks #1 to #n, in accordance with the state of peripheral circuitry 53.

ROM 52 stores procedure related to Sequences 1 and 2 for performing the conventional program sequence P1 as well as Sequence 0 for performing program sequence P0 in accordance with the first embodiment of the present invention.

When a command instructing programming of memory cell M is externally input, the command is decoded by command port 50, and CPU 51 reads Sequence 1. In accordance with the state of peripheral circuitry 53, one memory cell M which is the object of operation is selected out of memory blocks #1 to #n. The program pulse is applied to the selected cell M0.

CPU 51 stops, when it receives control signal CNT at the H level output from source potential clamp circuit 1, the conventional Sequence 1, and reads procedure for executing Sequence 0 of the first embodiment of the present invention. Consequently, Sequence 0, which will be described later, is executed on the non-selected cells connected to the same sub bit line SBL as the selected cell M0. Then, the control returns to Sequence 1 and after the end of Sequence 1, the conventional Sequence 2 is performed.

Source potential clamp circuit 1 in accordance with the first embodiment of the present invention will be described with reference to FIG. 2.

Source potential clamp circuit 1 detects change in source potential VS at the time of programming and clamps the source potential VS. The result of detection is transmitted to CPU 51 (FIG. 1).

Figure 2:
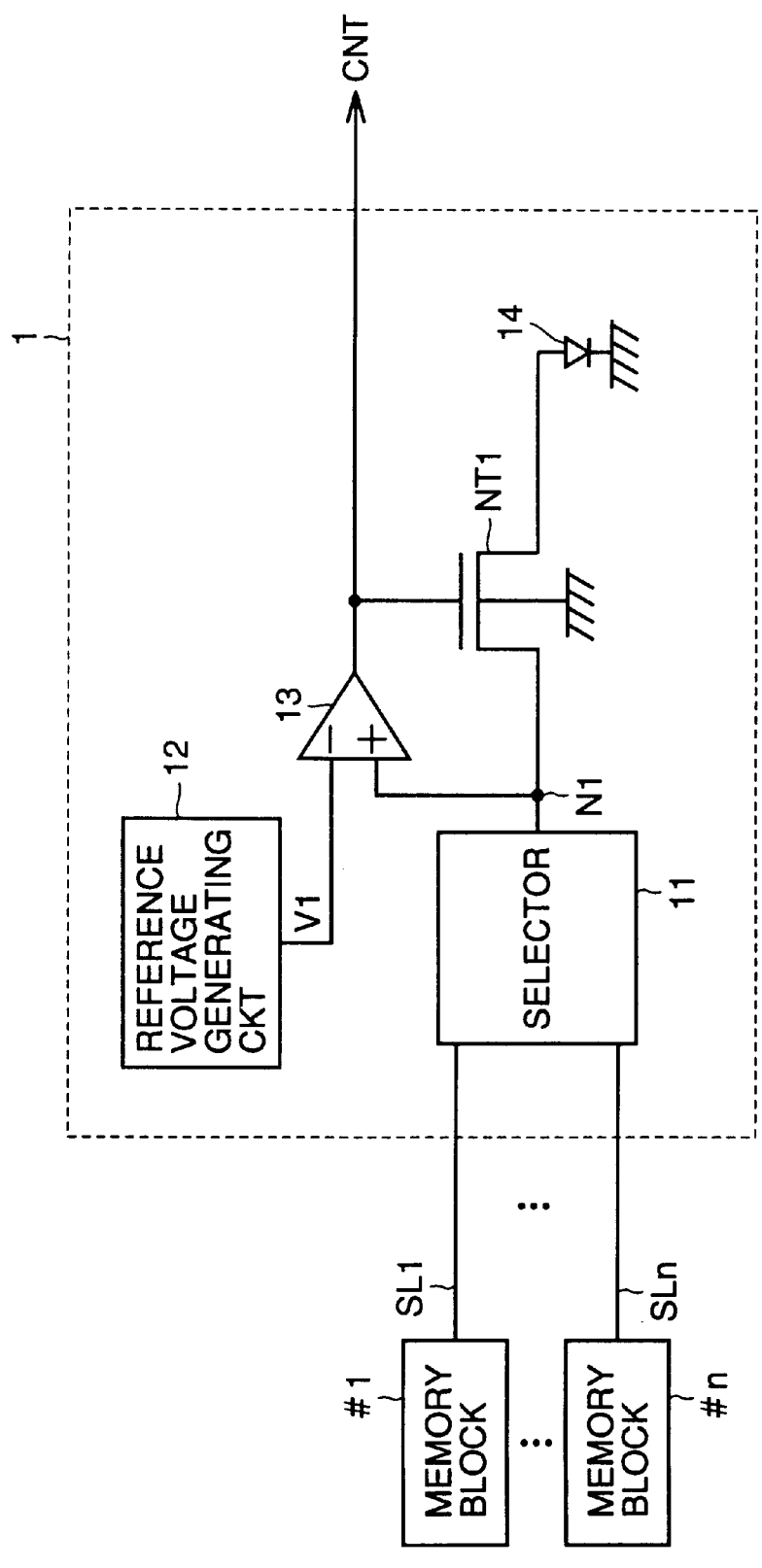
FIG. 2 shows basic configuration of a source potential clamp circuit 1 in accordance with the first embodiment of the present invention.

Referring to FIG. 2, source potential clamp circuit 1 includes a reference voltage generating circuit 12, a comparator 13, an MOS transistor NT1 and a PN diode 14. Reference characters SL1 to SLn in the figure denote source lines SL in respective memory blocks #1 to #n.

Selector 11 connects that source line SL which corresponds to one of the memory blocks #1 to #n which is to be programmed, to node N1. Comparator 13 compares potential of node N1 with an output from reference voltage generating circuit 12. As a result of comparison, control signal CNT is output from comparator 13. NMOS transistor NT1 is connected between an output of selector 11 and a P type substrate of PN diode 14, which will be described later, and receives at its gate electrode control signal CNT which is the output from comparator 13. The substrate of NMOS transistor NT1 is connected to the ground potential VSS. NMOS transistor NT1 is rendered conductive in accordance with control signal CNT which is the output from comparator 13. The N type substrate of PN diode 14 is connected to the ground potential VSS. Here, built in voltage of PN diode 14 is denoted by Vd.

Reference voltage generating circuit 12 generates a reference voltage for detecting the overbit cell OPbit. In the following, the potential of the reference voltage will be referred to as overbit generation detection level V1. The overbit generation detection level V1 is set higher than the source potential VS in the absence of overbit cell OPbit and lower than the clamp level Vclamp of source potential VS.

The operation of source potential clamp circuit 1 in accordance with the first embodiment of the present invention will be described in the following. It is assumed that the program pulse is applied to memory block #1. Source potential VS of source line SL1 increases as the program pulse is applied.

Selector 11 connects the source line SL1 of memory cell block #1, to which the program pulse is applied, to node N1. Reference voltage generating circuit 12 supplies a voltage at the overbit generation detection level V1 to comparator 13. Comparator 13 compares the source voltage VS of source line SL1 which is connected to node N1 with the overbit generation detection level V1.

The operation when source potential VS is lower than the overbit generation detection level V1 will be described. Comparator 13 outputs control signal CNT at the L (low) level. NMOS transistor NT1 is non-conductive, and source potential VS of source line SL1 does not change.

The operation when the source potential VS attains higher than the overbit generation detection level V1 will be described. Comparator 13 outputs control signal CNT at the H level. NMOS transistor NT1 is rendered conductive. Consequently, source line SL1 is connected to PN diode 14. When source potential VS of source line SL1 is not higher than built in potential Vd, the source potential VS is held. When source potential VS attains higher than the built in potential Vd, the potential VS of source line SL1 is fixed at the built in potential Vd.

Consequently, the upper limit of source potential VS of source line SL1 is suppressed to the level of the built in potential Vd of PN diode 14. More specifically, built in potential Vd of PN diode 14 corresponds to the clamp level Vclamp of source potential VS. By this configuration, it becomes possible to suppress increase in source potential VS which may cause gate disturbance.

Program sequence P0 for the selected page in accordance with the first embodiment of the present invention will be described with reference to FIG. 3.

Figure 3:
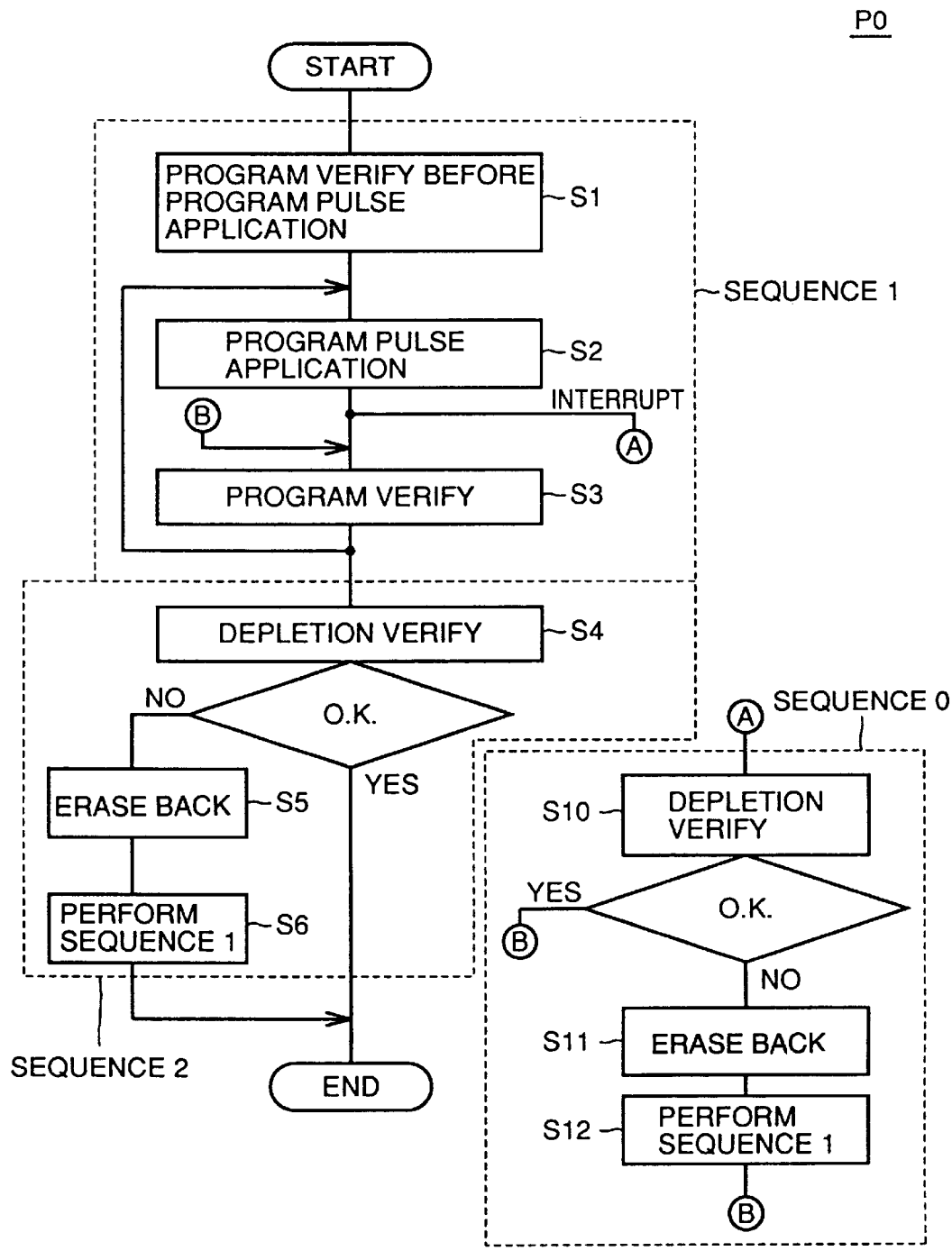
FIG. 3 is a flow chart showing program sequence P0 in accordance with the first embodiment of the present invention.

Referring to FIG. 3, Program Sequence P0 includes, in addition to the conventional Sequence 1 (Steps S1 to S3) and Sequence 2 (steps S4 to S6), Sequence 0 related to depletion verifying of the non-selected page (steps S10 to S12).

Referring to FIGS. 1 to 3, the operation when control signal CNT at the L level is output from source potential clamp circuit 1 will be described. In this case, Sequence 1 is performed on memory cell M existing in the selected page, similar to the conventional program sequence of P1.

The operation when control signal CNT at the H level is output from source potential clamp circuit 1 while the program pulse is being applied will be described. Upon reception of control signal CNT at the H level, CPU 52 reads Sequence 0. Consequently, Sequence 1 is interrupted.

In Sequence 0, depletion verifying operation is performed on the non-selected bit M1 connected to the same sub bit line SBL as the selected bit M0 (step S10). When the non-selected bit M1 passes the depletion verifying operation, the control returns to program verifying operation (steps S3) of the interrupted Sequence 1. When the non-selected bit M1 fails the depletion verifying operation, the operation of erasure and write over again is performed (step S11), and Sequence 1 is performed (step S12). The threshold voltage of the overbit cell OPbit belonging to the same sub bit line SBL as the selected bit M0 is recovered to the high state. After completion of Sequence 1, the flow returns to the program verifying operation (steps S3).

For the selected page, Sequences 1 and 0 are performed. After Sequences 1 and 0 are performed on the selected page, depletion verifying operation of the selected page is performed in Sequence 2.

Transition in source potential VS of the source line connected to the selected cell M0 in accordance with the first embodiment of the present invention will be described with reference to FIG. 4.

Figure 4:
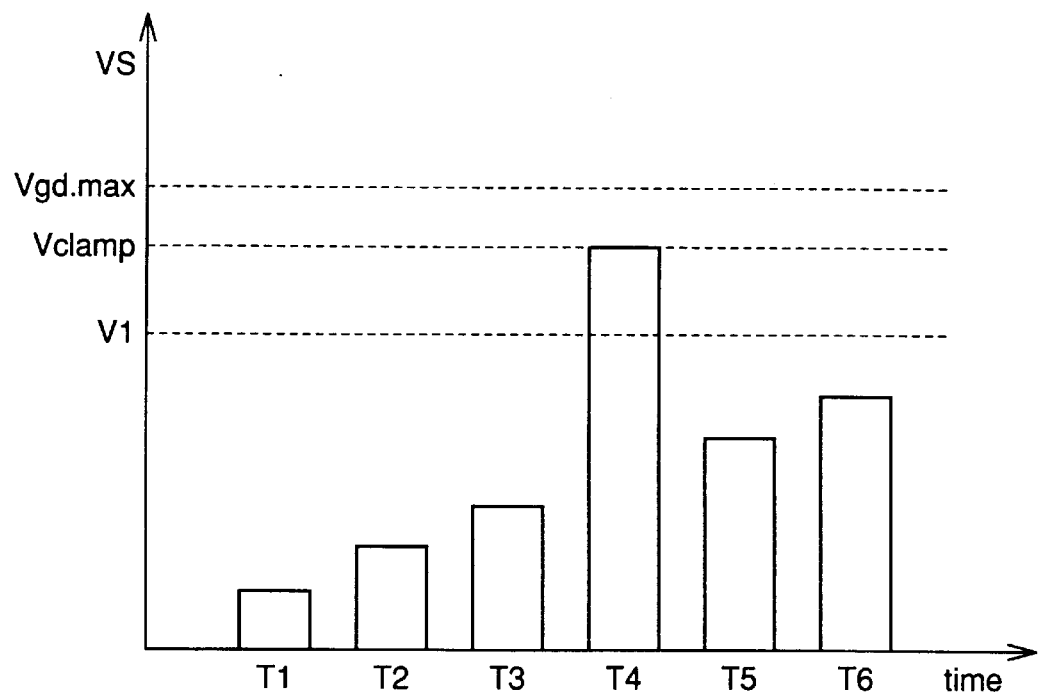
FIG. 4 is a timing chart showing change in source potential VS connected to a selected cell in a semiconductor integrated circuit device 200 in accordance with the first embodiment of the present invention.

Referring to FIG. 4, from time T1 to T3, source potential VS increases every time the program pulse is applied to the selected cell M0.

At time T4, source potential VS exceeds the overbit generation detection level V1. Though source potential VS further increases, source potential VS is clamped at clamp level Vclamp by source potential clamp circuit 1 at time T5.

At this time point, Sequence 0 described above is performed. As a result, before the application of the next program pulse (time T6), the threshold voltage of the overbit cell OPbit in the non-selected cells M1 connected to the same sub bit line SBL as the selected cell M0 is recovered to be within the normal range. Therefore, at time T6, source potential VS attains to a level lower than the overbit generation detection level V1.

By the above described configuration, it becomes possible to clamp the source potential VS at the time of programming. When the source potential VS exceeds the overbit generation detection level, the programming operation is interrupted, and the threshold voltage of the overbit cell Opbit of the non-selected cells M1 connected to the same sub bit line SBL as the selected page can be recovered to the normal range. This allows improvement in immunity to gate disturbance.

Second Embodiment

The source potential clamp circuit 2 in accordance with the second embodiment of the present invention will be described with reference to FIG. 5.

Figure 5:
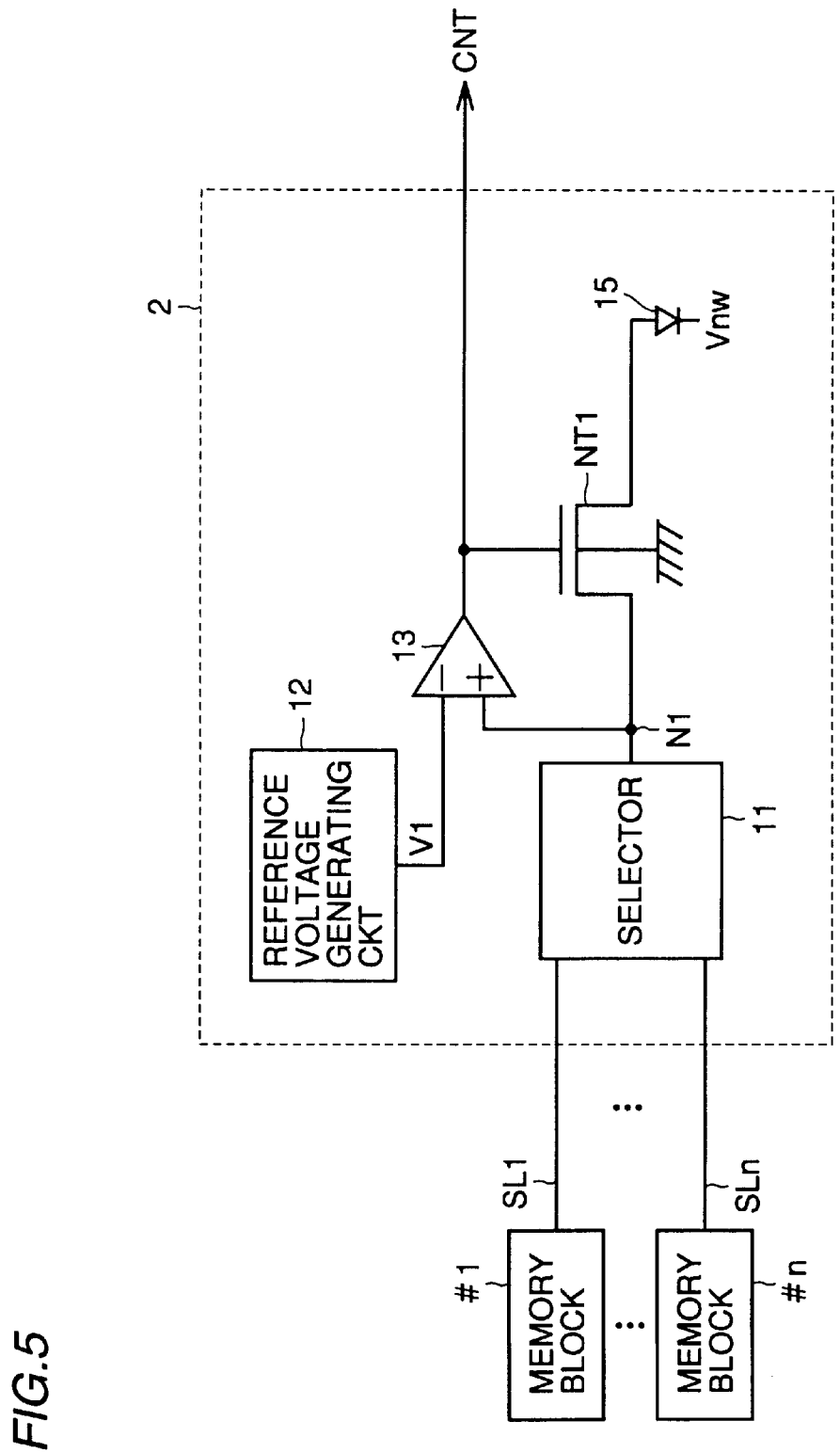
FIG. 5 shows basic configuration of a source potential clamp circuit in accordance with a second embodiment.

Referring to FIG. 5, source potential clamp circuit 2 in accordance with the second embodiment includes selector 11, reference voltage generating circuit 12, comparator 13, NMOS transistor NT1 and a Vnw controlled PN diode 15.

A P type substrate of Vnw controlled PN diode 15 is connected to NMOS transistor NT1, and an N type substrate is connected to power supply potential Vnw (>0 volt).

Consequently, the upper limit of source potential VS is suppressed to the level of (Vd+Vnw) with respect to the built in potential Vd of PN diode 15. In other words, the level of built in potential Vd of PN diode 15 plus the level of Vnw corresponds to the clamp level Vclamp of source potential VS.

By this configuration, it becomes possible to suppress increase in source potential VS which is a cause of acceleration of gate disturbance.

Different from source potential clamp circuit 1 in accordance with the first embodiment of the present invention, it is possible by source potential clamp circuit 2 to change the source potential clamp level Vclamp, by changing the level of Vnw.

Accordingly, it becomes possible to suppress fluctuation of built it potential Vd derived from process variation of PN diode 15, and to suppress fluctuation of the clamp level Vclamp.

In semiconductor integrated circuit device 100 shown in FIG. 1, when source potential clamp circuit 2 shown in FIG. 5 is used in place of source potential clamp circuit 1, it is possible to suppress increase in source potential VS as in the first embodiment. Further, in accordance with control signal CNT output from source potential clamp circuit 2, program sequence P0 shown in FIG. 3 is executed.

As a result, immunity to gate disturbance can be improved.

Third Embodiment

Figure 6:
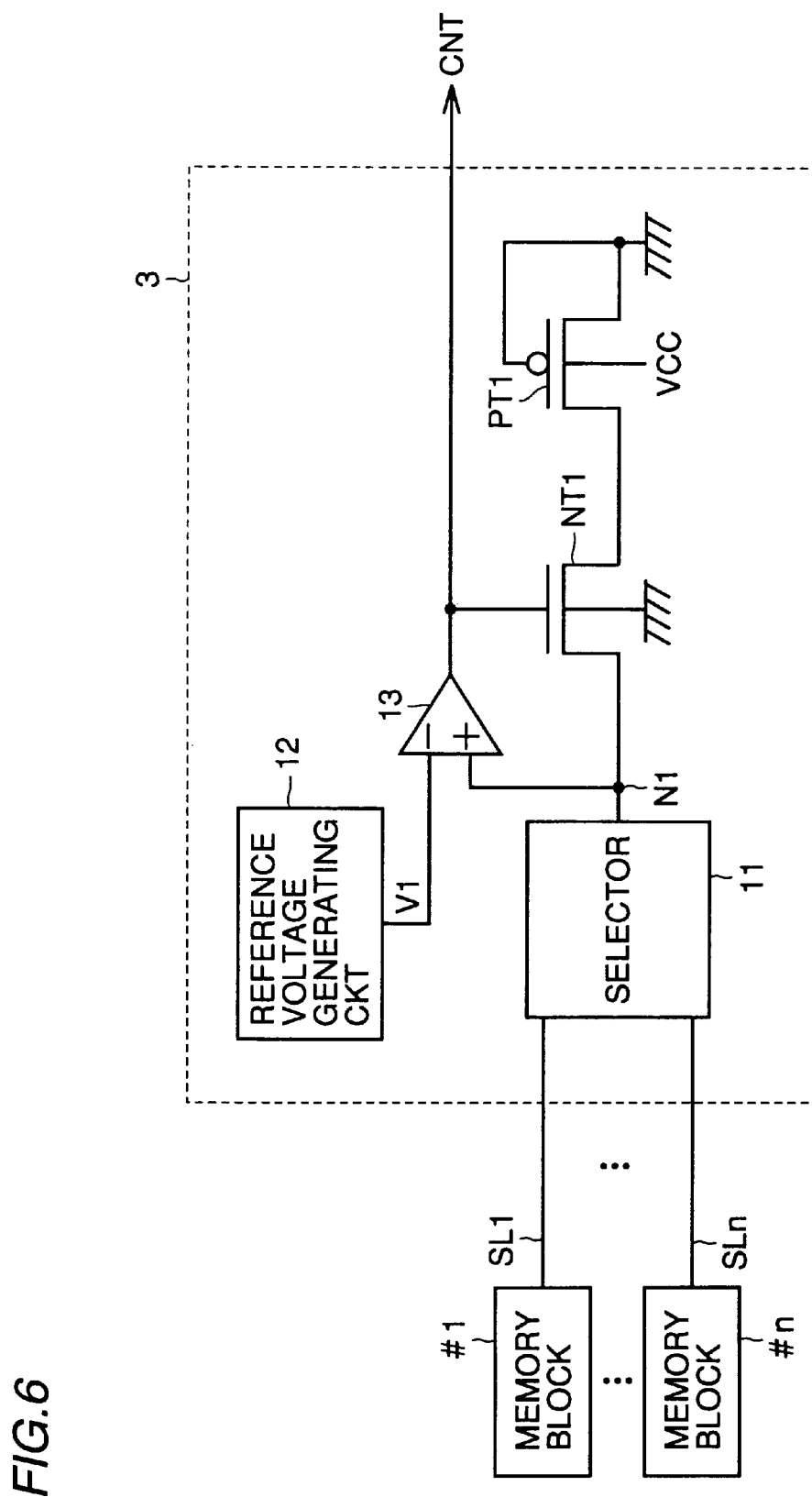
FIG. 6 shows a basic configuration of a source potential clamp circuit 3 in accordance with a third embodiment of the present invention.

A source potential clamp circuit 3 in accordance with the third embodiment of the present invention will be described with reference to FIG. 6. Referring to FIG. 6, source potential clamp circuit 3 in accordance with the third embodiment of the present invention includes selector 11, reference voltage generating circuit 12, comparator 13, NMOS transistor NT1 and PMOS transistor P1.

PMOS transistor P1 is connected between NMOS transistor NT and the ground potential VSS. PMOS transistor PT1 has its gate electrode connected to the ground VSS. Further, the substrate of PMOS transistor PT1 is connected to the power supply voltage VCC (>0 volt).

Consequently, the upper limit of source potential VS is suppressed to the threshold voltage Vthp of PMOS transistor PT1. More specifically, the threshold voltage Vthp of PMOS transistor PT1 corresponds to the clamp level Vclamp of source potential VS.

By this configuration, it becomes possible to suppress increase in source potential VS, and to prevent generation of overbit cell OPbit caused by increase in the source potential.

When source potential clamp circuit 3 shown in FIG. 6 is used in place of source potential clamp circuit 1 of the semiconductor integrated circuit device 100 shown in FIG. 1, it becomes possible to suppress increase in source potential VS as in the first embodiment. Further, program sequence P0 shown in FIG. 3 is executed in accordance with control signal CNT output from source potential clamp circuit 3.

As a result, immunity to gate disturbance can be improved.

Fourth Embodiment

A source potential clamp circuit 4 in accordance with the fourth embodiment of the present invention will be described with reference to FIG. 7.

Figure 7:
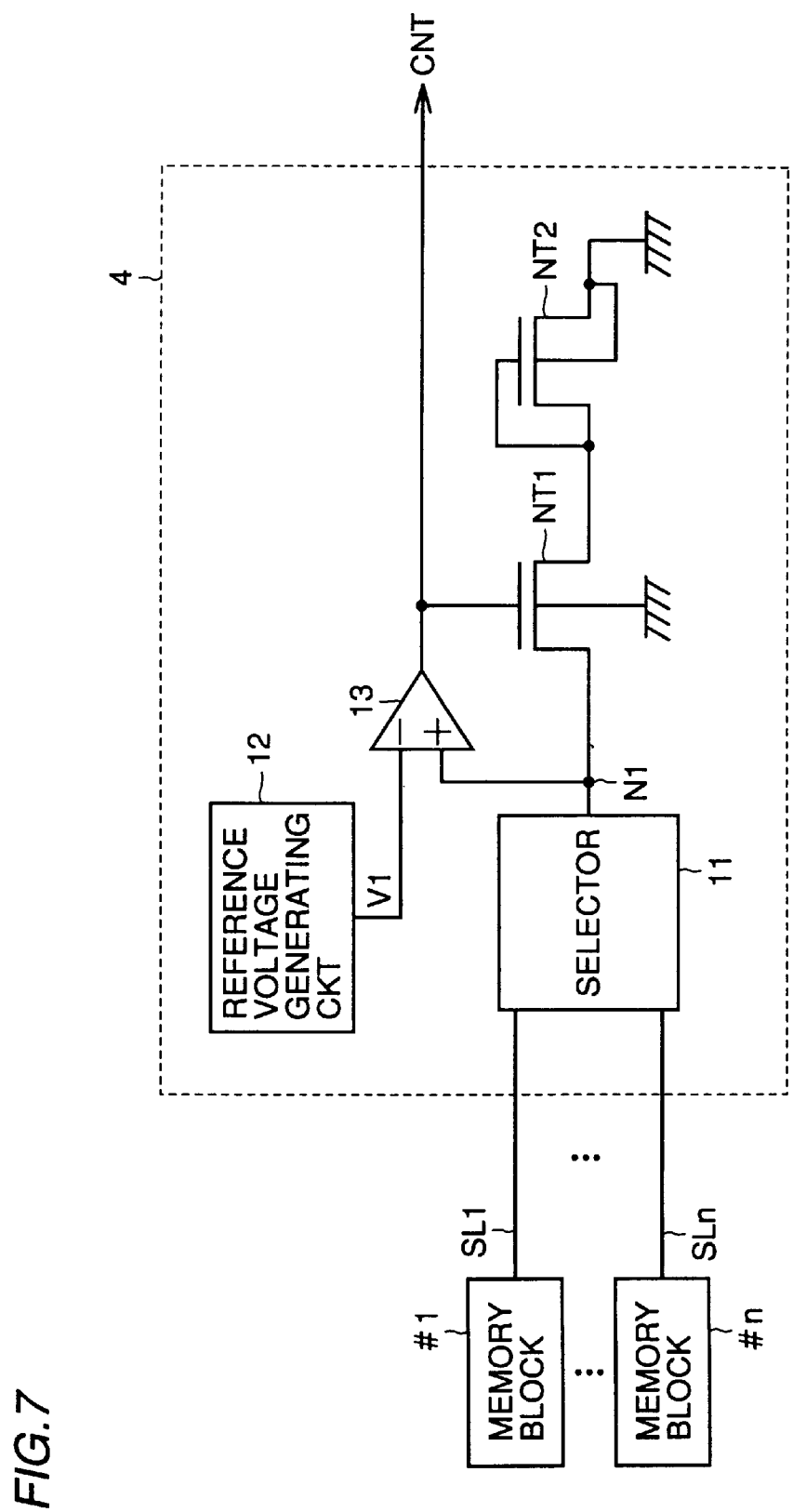
FIG. 7 shows a basic configuration of a source potential clamp circuit 4 in accordance with a fourth embodiment of the present invention.

Referring to FIG. 7, source potential clamp circuit 4 in accordance with the fourth embodiment of the present invention includes selector 11, reference voltage generating circuit 12, comparator 13 and NMOS transistors NT1 and NT2.

NMOS transistor NT2 has one conduction terminal and gate electrode connected to NMOS transistor NT1. NMOS transistor NT1 has the other conduction terminal connected to the ground potential VSS. The substrate of NMOS transistor NT2 is connected to the ground potential VSS.

Consequently, the upper limit of source potential VS is suppressed to the threshold voltage Vthn of NMOS transistor NT2. In other words, the threshold voltage Vthn of NMOS transistor NT2 corresponds to the clamp level Vclamp of source potential VS.

By this configuration, it becomes possible to suppress increase in source potential VS and to prevent generation of overbit cell OPbit caused by the increase in source potential.

When source potential clamp circuit 4 shown in FIG. 7 is used in place of source potential clamp circuit 1 of the semiconductor integrated circuit device 100 shown in FIG. 1, it is possible to suppress increase in source potential VS as in the first embodiment. Further, program sequence P0 shown in FIG. 3 is executed in accordance with control signal CNT output from source potential clamp circuit 4.

As a result, immunity to gate disturbance can be improved.

Fifth Embodiment

A source potential clamp circuit 5 in accordance with the fifth embodiment of the present invention will be described with reference to FIG. 8.

Figure 8:
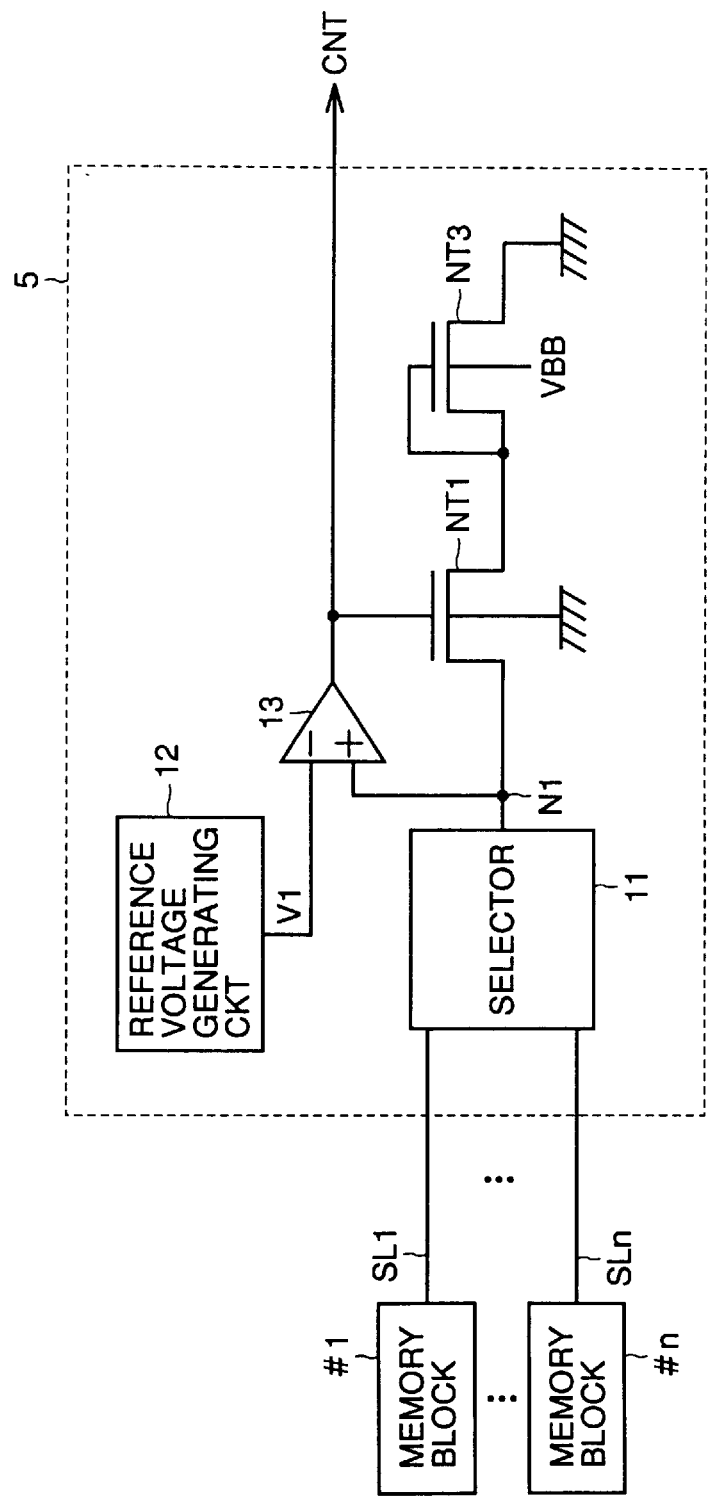
FIG. 8 shows a basic configuration of source potential clamp circuit 5 in accordance with a fifth embodiment of the present invention.

Referring to FIG. 8, source potential clamp circuit 5 in accordance with the fifth embodiment of the present invention includes selector 11, reference voltage generating circuit 12, comparator 13, NMOS transistors NT1 and NT3.

NMOS transistor NT3 has one conduction terminal and gate electrode connected to NMOS transistor NT1. NMOS transistor NT3 has the other conduction terminal connected to the ground potential VSS. Further, the substrate of NMOS transistor NT3 is connected to the power supply potential VBB (<0 volt).

Consequently, the clamp level Vclamp of source potential VS is set to the threshold voltage Vthn of NMOS transistor NT3, and in addition, the threshold voltage Vthn can be changed by changing VBB level.

As a result, it becomes possible to suppress fluctuation of the threshold voltage Vthn derived from process variation of NMOS transistor NT3, and to suppress fluctuation of clamp level Vclamp.

When source potential clamp circuit 5 shown in FIG. 8 is used in place of source potential clamp circuit 1 of the semiconductor integrated circuit device 100 shown in FIG. 1, it is possible to suppress increase in source potential VS as in the first embodiment. Further, program sequence P0 shown in FIG. 3 is executed in accordance with control signal CNT output from source potential clamp circuit 5.

As a result, it becomes possible to improve immunity to gate disturbance.

As described above, according to the method of programming of the present invention, it is possible to suppress increase in the source potential when the program pulse is applied to the selected cell, and it is possible to recover the threshold voltage, which fluctuates because of gate disturbance, of the non-selected memory cell connected to the same sub bit line as the selected memory cell. Therefore, immunity to gate disturbance can be improved.

According to the method of programming of the present invention, it is possible to clamp the source potential every time the program pulse is selected to the selected cell and to recover the threshold voltage of the non-selected memory cell. Therefore, immunity to gate disturbance can be improved.

According to the method of programming in accordance with the present invention, it is possible to perform the method of programming page by page, in a DINOR type flash memory in which memory cells are divided into groups on page by page basis. Therefore, it becomes possible to improve immunity to gate disturbance in page programming, ensuring reliability of the flash memory.

According to the semiconductor integrated circuit device of the present invention, it is possible to suppress increase in source potential which is a cause of deterioration of gate disturbance immunity. Further, threshold voltage of non-selected memory cells connected to the same sub bit line as the selected memory cell, which threshold voltage fluctuates because of gate disturbance, can be recovered. Therefore, immunity to gate disturbance can be improved.

According to the semiconductor integrated circuit device of the present invention, it is possible to clamp the source potential every time the program pulse is applied to the selected cell, and it is also possible to recover the threshold voltage of non-selected memory cells. Therefore, immunity to gate disturbance can be improved.

According to the semiconductor integrated circuit device of the present invention, it is possible to clamp the source potential by using a PN diode.

According to the semiconductor integrated circuit device of the present invention, by using a PN diode receiving at the N type substrate a positive power supply potential, it is possible to clamp the source potential. Further, it becomes possible to suppress fluctuation of the clamp potential, not influenced by variation of PN diode.

According to the semiconductor integrated circuit device of the present invention, it is possible to clamp the source potential by using a PMOS transistor.

According to the semiconductor integrated circuit device of the present invention, it is possible to clamp the source potential by using an NMOS transistor.

Further, according to the semiconductor integrated circuit device of the present invention, by using an NMOS transistor receiving at its substrate a negative power supply potential, it is possible to clamp the source potential. Further, fluctuation of clamp potential can be suppressed not influenced by variation of NMOS transistor.

Further, according to the semiconductor integrated circuit device of the present invention, in a DINOR type flash memory in which memory cells are divided into groups on page by page basis, it is possible to clamp the source potential page by page, and to recover the threshold voltage of the non-selected memory cells. Therefore, it is possible to improve gate disturbance immunity in page programming, ensuring reliability of the flash memory.

According to the method of programming of the present invention, it is possible to detect transition in the source potential when the program pulse is applied to the selected cell, and it is possible to recover the threshold voltage, which fluctuates because of gate disturbance, of the non-selected memory cell connected to the same sub bit line as the selected memory cell. Therefore, immunity to gate disturbance can be improved.

According to the method of programming of the present invention, it is possible to detect transition in the source potential every time the program pulse is selected to the selected cell and to recover the threshold voltage of the non-selected memory cell. Therefore, immunity to gate disturbance can be improved.

According to the method of programming in accordance with the present invention, it is possible to perform the method of programming page by page, in a DINOR type flash memory in which memory cells are divided into groups on page by page basis. Therefore, it becomes possible to improve immunity to gate disturbance in page programming, ensuring reliability of the flash memory.

According to the semiconductor integrated circuit device of the present invention, it is possible to detect transition in source potential which is a cause of deterioration of gate disturbance immunity. Further, threshold voltage of non-selected memory cells connected to the same sub bit line as the selected memory cell, which threshold voltage fluctuates because of gate disturbance, can be recovered. Therefore, immunity to gate disturbance can be improved.

According to the semiconductor integrated circuit device of the present invention, it is possible to detect transition in the source potential every time the program pulse is applied to the selected cell, and it is also possible to recover the threshold voltage of non-selected memory cells. Therefore, immunity to gate disturbance can be improved.

Further, according to the semiconductor integrated circuit device of the present invention, in a DINOR type flash memory in which memory cells are divided into groups on page by page basis, it is possible to detect transition in the source potential, and to recover the threshold voltage of the non-selected memory cells. Therefore, it is possible to improve gate disturbance immunity in page programming, ensuring reliability of the flash memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor integrated circuit device including an electrically erasable, programmable and readable non-volatile semiconductor memory, a method of programming said non-volatile semiconductor memory, comprising the steps of
   setting any one of a plurality of memory cells constituting said non-volatile semiconductor memory to a selected state and applying a program pulse to said selected cell;
   upon application of the program pulse to said selected memory cell, detecting transition in potential of a source line connected to said selected memory cell, and clamping the potential of said source line; and
   based on a result of detection in said step of clamping, recovering threshold voltage of a non-selected memory cell connected to a sub bit line connected to said selected memory cell.

2. The method of programming according to claim 1, wherein
   said step of clamping includes the steps of
      generating a reference voltage for detecting generation of an overbit,
      comparing the potential of said source line connected to said selected memory cell with said potential of said reference voltage and outputting a control signal,
      generating a prescribed clamp voltage, and
      in accordance with a result of said step of comparing, supplying said prescribed clamp voltage to said source line connected to said selected memory cell,
   said method of programming further comprising the steps of
      after application of the program pulse to said selected memory cell and before application of a next program pulse, operating said step of recovery, based on said control signal output in said step of comparison.

3. The method of programming according to claim 2, wherein
   said non-volatile semiconductor memory is a DINOR type flash memory having said plurality of memory cells divided into groups on page by page basis,
   said selected memory cell and said non-selected memory cell exist in different said pages,
   said method further comprising
      page control step for selecting any one of said pages, for performing said steps of clamping and recovery at an application of a program pulse to each of said plurality of memory cells existing in said selected page.

4. A semiconductor integrated circuit device including an electrically erasable and programmable non-volatile semiconductor memory, comprising:
   a decode circuit for setting one of a plurality of memory cells constituting said non-volatile semiconductor memory to a selected state;
   a write circuit for writing to said selected memory cell in accordance with said decode circuit;
   a plurality of source lines connected to said plurality of memory cells;
   a clamp circuit for detecting transition in potential of that one of the source lines which is connected to said selected memory cell during writing operation of said selected memory cell, for clamping potential of said source line; and
   a recovery circuit for recovering threshold value of a non-selected memory cell connected to a sub bit line connected to said selected memory cell, in accordance with result of said detection by said clamp circuit.

5. The semiconductor integrated circuit device according to claim 4, wherein
   said clamp circuit includes
      a reference voltage generating circuit for generating a reference voltage for detecting generation of an overbit,
      a comparing circuit for comparing potential of the source line connected to said selected memory cell and potential of the reference voltage output from said reference voltage generating circuit and outputting a control signal,
      a voltage supplying circuit for generating a prescribed clamp voltage, and
      a switch circuit for electrically connecting the source line connected to said selected memory cell and said voltage supplying circuit, in accordance with said control signal,
   said semiconductor integrated circuit device further comprising:
      a control circuit for operating said recovery circuit based on said control signal output from said comparison circuit after writing to said selected memory cell and before next writing.

6. The semiconductor integrated circuit device according to claim 5, wherein
   said voltage supplying circuit includes a PN diode having a P type substrate connected to said switch circuit and an N type substrate connected to a ground potential.

7. The semiconductor integrated circuit device according to claim 5, wherein
   said voltage supplying circuit includes a PN diode having a P type substrate connected to said switch circuit and an N type substrate connected to a positive first power supply potential.

8. The semiconductor integrated circuit device according to claim 5, wherein
   said voltage supplying circuit includes a PMOS transistor connected between said switch circuit and a ground potential, and having a gate electrode connected to the ground potential and a substrate connected to a positive power supply voltage.

9. The semiconductor integrated circuit device according to claim 5, wherein
   said voltage supplying circuit includes
      a NMOS transistor diode connected between said switch circuit and a ground potential, and having a substrate connected to the ground potential.

10. The semiconductor integrated circuit device according to claim 5, wherein
   said voltage supplying circuit includes a NMOS transistor diode connected between said switch circuit and a ground potential, and having a substrate connected to a negative power supply voltage.

11. The semiconductor integrated circuit device according to claim 6, wherein
   said non-volatile semiconductor memory device is a DINOR type flash memory having said plurality of memory cells divided into groups on page by page basis,
   said selected memory cell and said non-selected memory cell exist in different said pages,
   said semiconductor integrated circuit device further comprising:
      page control circuit for selecting any one of said pages and operating said clamp circuit and said recovery circuit at an application of a program pulse to each of said plurality of memory cells existing in said selected page.

12. The semiconductor integrated circuit device according to claim 7,
   said non-volatile semiconductor memory device is a DINOR type flash memory having said plurality of memory cells divided into groups on page by page basis,
   said selected memory cell and said non-selected memory cell exist in different said pages,
   said semiconductor integrated circuit device further comprising:
      page control circuit for selecting any one of said pages and operating said clamp circuit and said recovery circuit at an application of a program pulse to each of said plurality of memory cells existing in said selected page.

13. The semiconductor integrated circuit device according to claim 8,
   said non-volatile semiconductor memory device is a DINOR type flash memory having said plurality of memory cells divided into groups on page by page basis,
   said selected memory cell and said non-selected memory cell exist in different said pages,
   said semiconductor integrated circuit device further comprising:
      page control circuit for selecting any one of said pages and operating said clamp circuit and said recovery circuit at an application of a program pulse to each of said plurality of memory cells existing in said selected page.

14. The semiconductor integrated circuit device according to claim 9, wherein
   said non-volatile semiconductor memory device is a DINOR type flash memory having said plurality of memory cells divided into groups on page by page basis,
   said selected memory cell and said non-selected memory cell exist in different said pages,
   said semiconductor integrated circuit device further comprising:
      a page control circuit for selecting any one of said pages and operating said clamp circuit and said recovery circuit at an application of a program pulse to each of said plurality of memory cells existing in said selected page.

15. The semiconductor integrated circuit device according to claim 10,
   said non-volatile semiconductor memory device is a DINOR type flash memory having said plurality of memory cells divided into groups on page by page basis,
   said selected memory cell and said non-selected memory cell exist in different said pages,
   said semiconductor integrated circuit device further comprising:
      page control circuit for selecting any one of said pages and operating said clamp circuit and said recovery circuit at every application of a program pulse to each of said plurality of memory cells existing in said selected page.

16. In a semiconductor integrated circuit device including an electrically erasable, programmable and readable non-volatile semiconductor memory, a method of programming said non-volatile semiconductor memory, comprising the steps of
   setting any one of a plurality of memory cells constituting said non-volatile semiconductor memory to a selected state and applying a program pulse to said selected cell;
   upon application of the program pulse to said selected memory cell, detecting transition in potential of a source line connected to said selected memory cell, and
   based on a result of detection in said step of detecting transition in potential, recovering threshold voltage of a non-selected memory cell connected to a sub bit line connected to said selected memory cell.

17. The method of programming according to claim 16, wherein
   said step of detecting transition in potential includes the steps of
      generating a reference voltage for detecting generation of an overbit, and
      comparing the potential of said source line connected to said selected memory cell with said potential of said reference voltage and outputting a control signal,
   said method of programming further comprising the steps of
      after application of the program pulse to said selected memory cell and before application of a next program pulse, detecting transition in threshold voltage of said non-selected memory cell based on a control signal output in said step of comparing; and
      based on a result of detection in said detecting step, controlling by operating said step of recovery.

18. The method of programming according to claim 17, wherein
   said non-volatile semiconductor memory is a DINOR type flash memory having said plurality of memory cells divided into groups on page by page basis,
   said selected memory cell and said non-selected memory cell exist in different said pages,
   said method further comprising
      page control step for selecting any one of said pages, for performing said steps of detecting transition in potential and recovery at an application of a program pulse to each of said plurality of memory cells existing in said selected page.

19. A semiconductor integrated circuit device including an electrically erasable and programmable non-volatile semiconductor memory, comprising:
   a decode circuit for setting one of a plurality of memory cells constituting said non-volatile semiconductor memory to a selected state;
   a write circuit for writing to said selected memory cell in accordance with said decode circuit;
   a plurality of source lines connected to said plurality of memory cells;
   a potential transition detecting circuit for detecting transition in potential of that one of the source lines which is connected to said selected memory cell during writing operation of said selected memory cell; and
   a recovery circuit for recovering threshold value of a non-selected memory cell connected to a sub bit line connected to said selected memory cell, in accordance with result of said detection by said potential transition detecting circuit.

20. The semiconductor integrated circuit device according to claim 19, wherein
   said potential transition detecting circuit includes
   a reference voltage generating circuit for generating a reference voltage for detecting generation of an overbit, and
   a comparing circuit for comparing potential of the source line connected to said selected memory cell and potential of the reference voltage output from said reference voltage generating circuit,
   said semiconductor integrated circuit device further comprising:
   a control circuit for operating said recovery circuit based on said control signal output from said comparison circuit after writing to said selected memory cell and before next writing.

21. The semiconductor integrated circuit device according to claim 20, wherein
   said non-volatile semiconductor memory device is a DINOR type flash memory having said plurality of memory cells divided into groups on page by page basis,
   said selected memory cell and said non-selected memory cell exist in different said pages,
   said semiconductor integrated circuit device further comprising:
   a page control circuit for selecting any one of said pages and operating said clamp circuit and said recovery circuit at an application of a program pulse to each of said plurality of memory cells existing in said selected page.

* * * * *